(12) United States Patent
Daoudi et al.

(10) Patent No.: US 6,453,441 B1
(45) Date of Patent: Sep. 17, 2002

(54) ERROR CORRECTING DEVICE AND OPTICAL DISK READER COMPRISING SAME

(75) Inventors: Mohamed Daoudi, Crolles; Philippe Isola, Grenoble; Philippe Paul, Biviers; Christophe Viroulaud, Grenoble, all of (FR)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 09/646,053

(22) PCT Filed: Mar. 12, 1999

(86) PCT No.: PCT/FR99/00549

§ 371 (c)(1),
(2), (4) Date: Feb. 8, 2001

(87) PCT Pub. No.: WO99/48216

PCT Pub. Date: Sep. 23, 1999

(30) Foreign Application Priority Data

Mar. 13, 1998 (FR) .............................................. 98 03103

(51) Int. Cl.⁷ ............................................. H03M 13/00
(52) U.S. Cl. ....................................... 714/784; 714/746
(58) Field of Search .................................. 714/784, 746, 714/755, 781; 375/262

(56) References Cited

U.S. PATENT DOCUMENTS

| | | | |
|---|---|---|---|
| 4,868,828 A | * | 9/1989 | Shao et al. |
| 5,170,399 A | * | 12/1992 | Cameron et al. |
| 5,642,367 A | * | 6/1997 | Kao |
| 5,715,262 A | * | 2/1998 | Gupta |
| 6,031,875 A | * | 2/2000 | Im .............................. 375/262 |

* cited by examiner

*Primary Examiner*—Phung M. Chung
(74) *Attorney, Agent, or Firm*—Joseph S. Tripoli; Paul P. Kiel

(57) ABSTRACT

A compact and fast coder-decoder of the Reed-Solomon type and a reader, which comprises such a coder-decoder. The present invention provides a coder-decoder that includes specific registers that are divided into elementary cells set in series and comprising means of multiplexing and of calculation such that during a cycle of a clock signal the data of two of the registers are shifted from one cell and a calculation operation is carried out for one of the data and it is subsequently possible to exchange simultaneously the data between the two registers.

18 Claims, 15 Drawing Sheets

4 OCTETS:
124: "SUBCODE ODD FRAME"
125: "S1/S0 REGISTER ODD FRAME"
126: "SUBCODE EVEN FRAME"
127: "S1/S0 REGISTER EVEN FRAME"

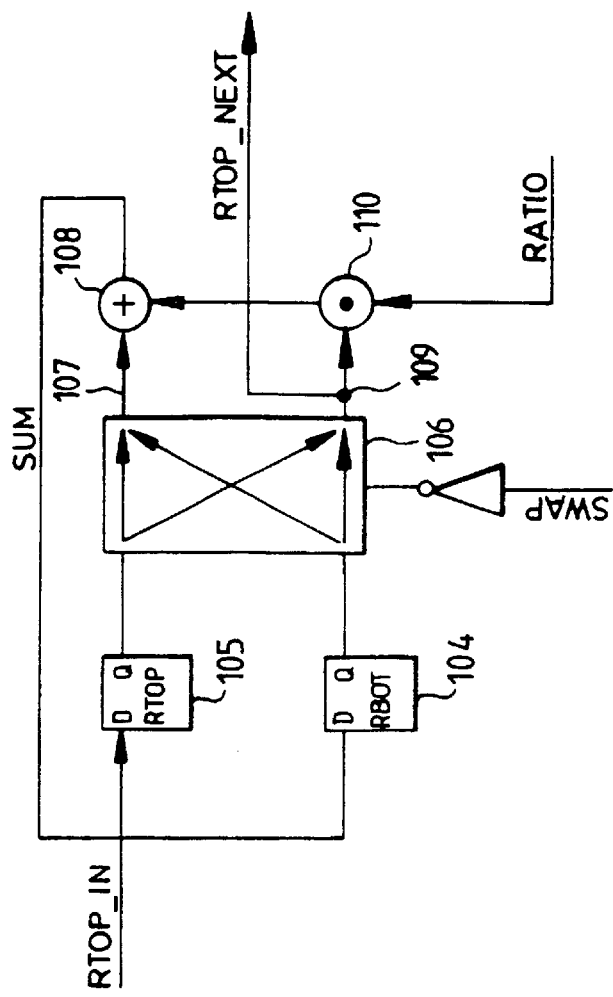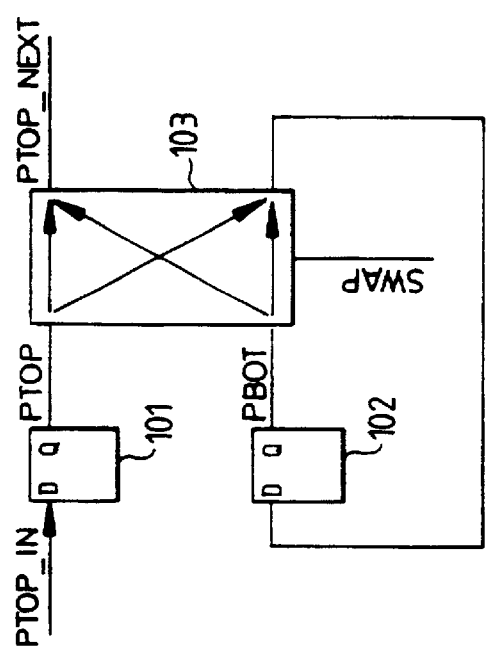
FIG.13

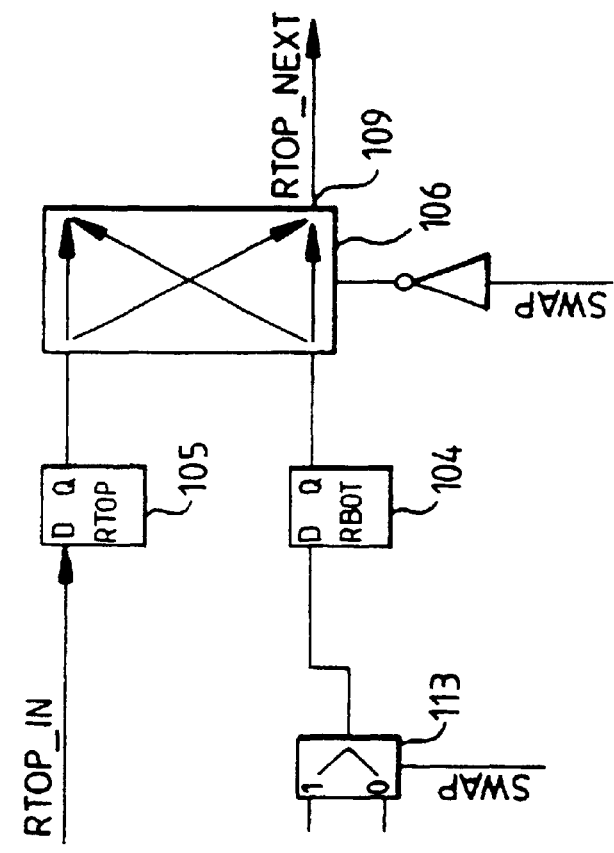
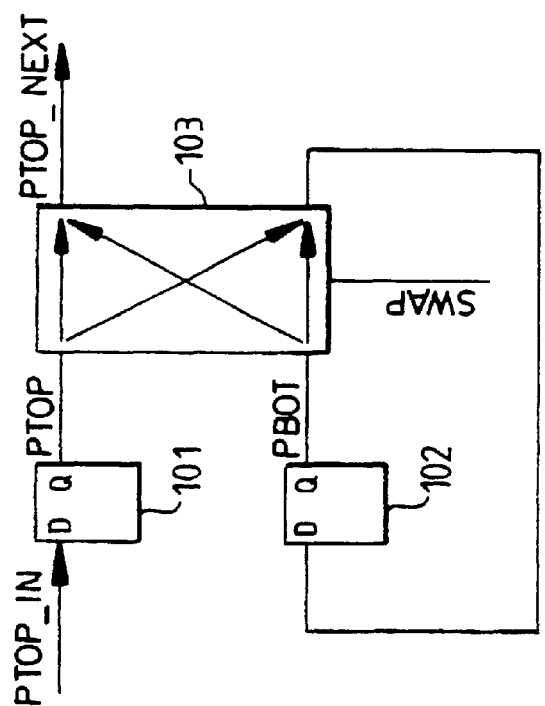
FIG. 14

ERROR CORRECTING DEVICE AND OPTICAL DISK READER COMPRISING SAME

1. Field of the Invention

The invention relates to a Reed-Solomon type error correcting device and an optical reading apparatus comprising such a device. The invention is applied especially within the framework of error correction in magneto-optic or optical disk reading apparatus.

2. Related Art

Reed-Solomon type error correction (RS) is used in numerous applications. One of the most widespread applications is the compact disk (CD). In the future, RS codes will likewise be used within the framework of the disks referred to as "DVD".

Although developed in the 1960's, RS codes were not used in apparatus for the general public until the beginning of the 1980's. This was due in part to the fact that this error correction requires a relatively substantial, and therefore costly, amount of computer power. The correction requires for example multiplication and division of polynomials as well as determination of the roots of polynomials. Within this framework, it is of interest to reduce the calculation time and to reduce the complexity of the circuits applied in this correction, with a view toward reducing cost and increasing reliability.

SUMMARY OF THE INVENTION

The object of the invention is a Reed-Solomon type coder-decoder comprising: a generator of syndromes for receiving a data flow and for providing a polynomial of syndrome and a polynomial of erasure; means of implementing Euclid's algorithm to receive said polynomials of syndrome and erasure and for providing error localization; means of correction for correcting, where applicable, the error or errors in the data flow with the aid of the polynomial of error localization; and in which the means of implementation include first and second registers for storing two intermediate polynomials of location and of evaluation of error, characterized in that the registers are divided into elementary cells set in series and comprising means of multiplexing and of calculation so that during a cycle of a clock signal when a calculation is carried out, it is subsequently possible simultaneously to reverse the data between the two registers.

The means of implementation are preferably arranged to implement the product of the polynomial of error localization and of a polynomial of erasure to obtain a new polynomial of error localization.

The extended Euclid algorithm necessitates the multiplication of polynomials. According to the invention, this fact is advantageously utilized to implement other multiplications of polynomials necessary for the error correction, which permits simplifying the other parts of the correction device.

According to one embodiment of the invention, the means of determination of the coefficients are arranged to implement the product of a polynomial of syndromes by the polynimial of erasure.

The invention also has as its object an optical disks reader comprising the correction device.

BRIEF DESCRIPTION OF THE DRAWINGS

Other advantages and characteristics of the invention will become apparent through the description of a non-limiting embodiment example described with the aid of the figures, among which describe.

DETAILED DESCRIPTION OF THE INVENTION

The CD (Compact Disk) standard recognizes the use of a cross-interleaved Reed-Solomon error correction code or CIRC. The use of this code entails the division of each digital sample of 16 bits to be coded into two symbols of 8 bits each.

Figure 1:
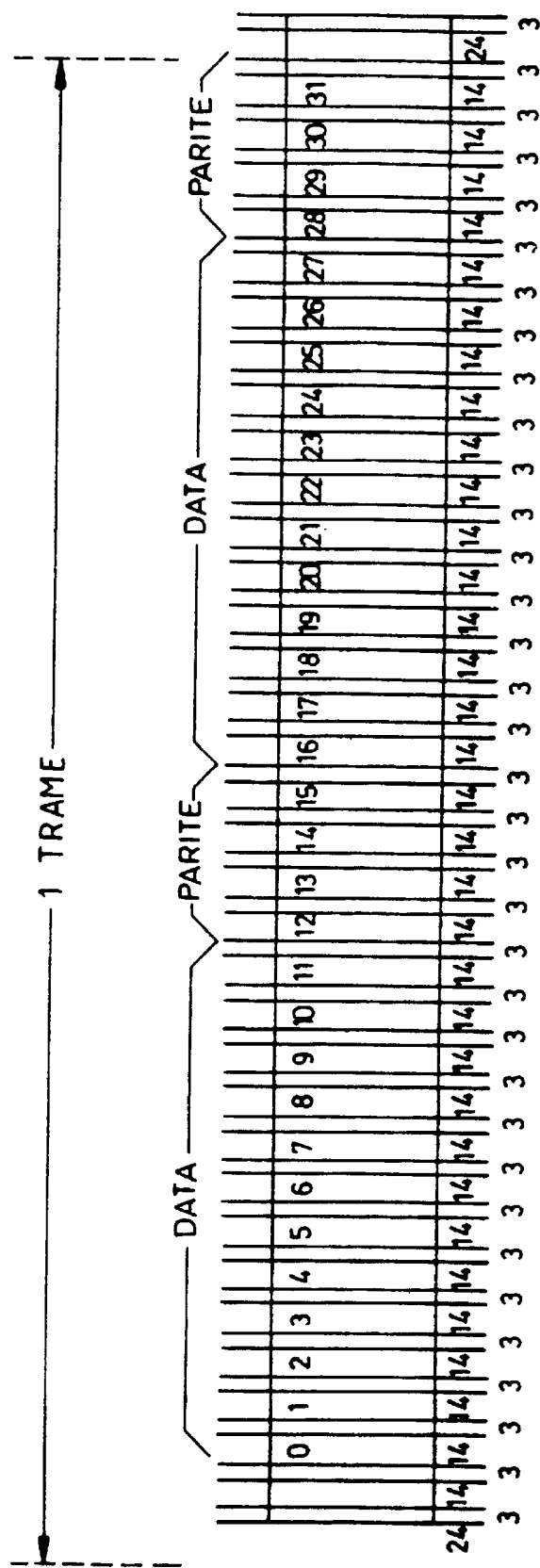
FIG. 1 a diagram illustrating the RS coding of a block of data of the CD type.

FIG. 1 illustrates more particularly the structure of a block of data (frame) according to the CD standard.

The samples to be coded are stored in a RAM memory and supplied to the encoder in the form of blocks of twenty-four symbols (corresponding to six samples of 16 bits for each of the two channels). According to a first stage, these symbols are interleaved, delaying by two samples the even samples and reversing the connections toward the first part of the encoder, referred to as encoder C2. The encoder C2 determines four parity symbols of 8 bits (referred to as Q symbols) from the code word of 24 symbols, and inserts the four parity symbols among the other symbols. This yields 28 symbols. The encoder C2 is therefore a (28, 24) encoder.

The symbols are transmitted to the second encoder, referred to as encoder C1, through 28 delay lines of unequal length, multiples of four blocks, so as to distribute the 28 symbols of one word over 28 different blocks. These 28 blocks will then be interleaved with other blocks at the rate of one block among the 28 blocks for three other blocks. The encoder adds four parity symbols of 8 supplementary bits (symbols P) to each block, bringing the total to 32 symbols. The encoder C1 is therefore a (32, 28) encoder. These symbols are utilized after a supplementary processing comprised of reversing the parity symbols and in delaying the even symbols, to form a data packet.

To these data are added a certain number of control data, which will not be discussed in detail. For further information on the data coding, reference is made inter alia to Chapter 9 of the work "Digital Audio and Compact Disk Technology, Third Edition, 1995, Sony Service Center Europe, or also to the work "Reed-Solomon Codes and Their Applications," Wicker/Bhjagarva, IEEE Press, 1994, Chapter 4.

The correction of CD type packets therefore necessitates two passes through a Reed-Solomon decoder, the first for the C1 decoding and the second for the C2 decoding, with a de-interleaving process between the two passes.

If the correction capacity of C1 is exceeded (as a function of the number of erasures and errors to be corrected), the 28 symbols (32 minus the four parity symbols P) are marked with erasure flags and are not corrected. During the de-interleaving, these 28 symbols will be distributed over 28 blocks.

If the correction capacity of C2 is exceeded, the 24 symbols (28 minus the four Q parity symbols) are marked with a flag and are not corrected.

The error correction used within the framework of the DVD (Digital Video/Versatile Disk) is different: a block of 192 lines of 172 symbols (one symbol=1 byte) is associated vertically with a Reed-Solomon code referred to as external ('PO') composed of 16 lines of 172 bytes, then horizontally to a Reed-Solomon code referred to as internal ('PI') composed of 208 lines of 10 bytes. The internal code is calculated from the data block and from the external code. The combination yields one block of 208 lines of 182 bytes. The 16 lines of the external code are then inserted among the 192 remaining lines so as to be interleaved.

Figure 2:
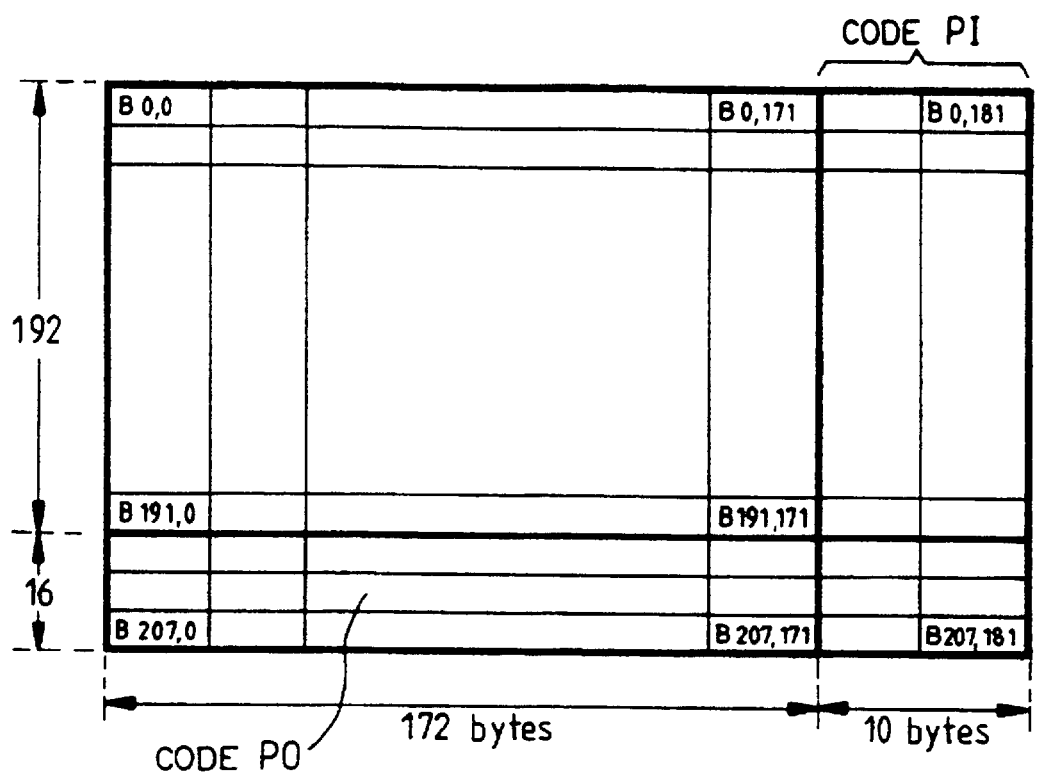
FIG. 2 a diagram illustrating the RS coding of a block of data of the DVD type.

The structure of a data packet according to the DVD standard is illustrated by FIG. 2.

Figure 3:
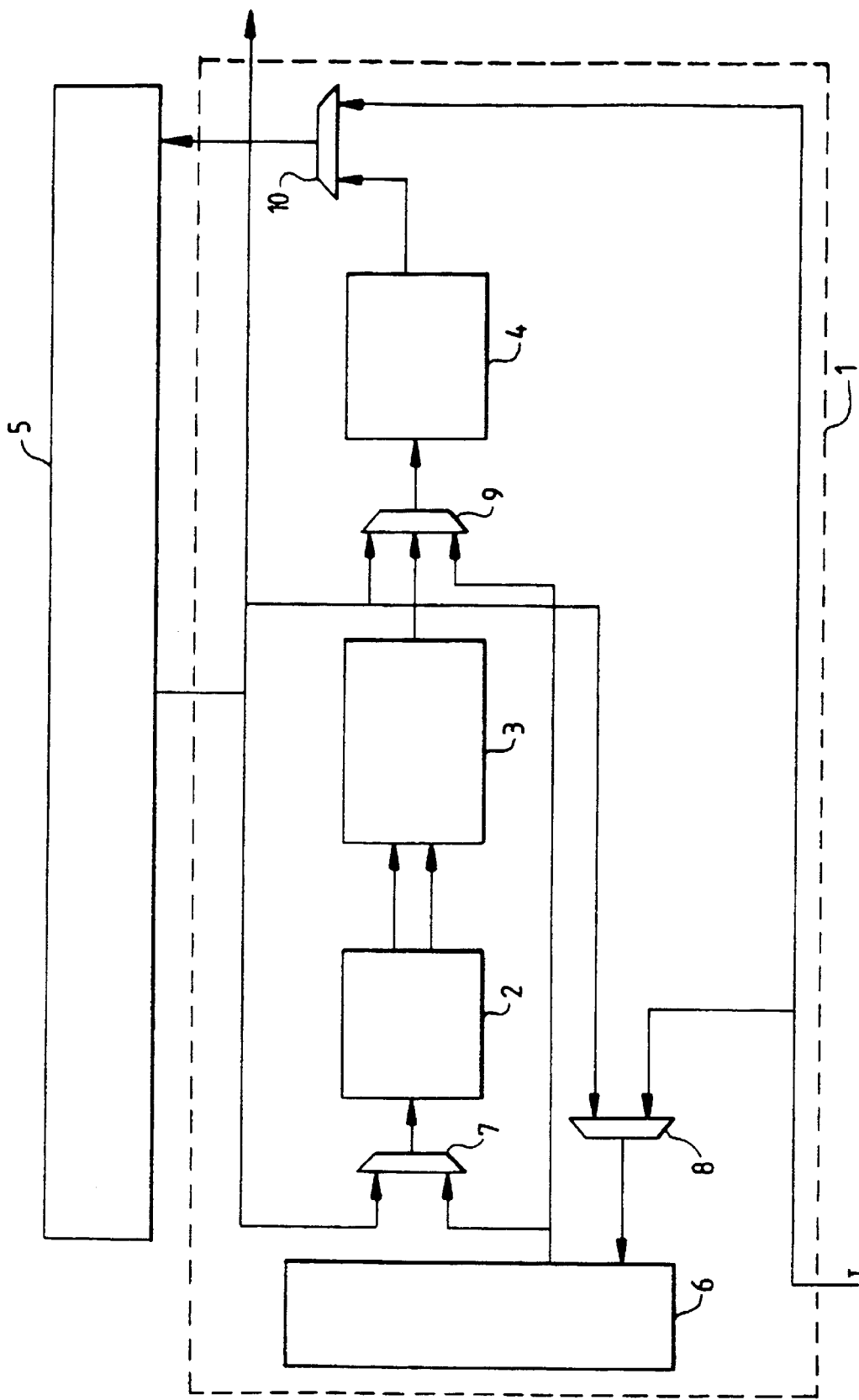
FIG. 3 a block diagram of the device according to the present embodiment example, FIG. 4 a block diagram illustrating the exchanges of data in the mode referred to as "DVD", FIG. 5 a block diagram illustrating the exchanges of data in the mode referred to as "CD", FIG. 6 a diagram illustrating the storage of a data packet of the DVD type in a memory of the device according to the invention, FIG. 7 a diagram illustrating the organization of the data inside a memory of the device according to the invention, FIG. 8 a schematic diagram of the two polynomial coefficient registers used to solve the equations of FIGS. 3 to 5, FIG. 9 a diagram illustrating the connection of cells to registers in an equation solving circuit used in Reed-Solomon decoding, FIG. 10 a block diagram 9 of a cell from FIG. 9, FIG. 11 a block diagram of the output end of the registers of FIG. 9, FIG. 12 a block diagram of the cell of FIG. 10 in a first configuration, FIG. 13 a block diagram of the cell of FIG. 10 in a second configuration, FIG. 14 a block diagram of the cell of FIG. 10 in a third configuration, FIG. 15 a block diagram of several cells of FIG. 10 placed in series according to a first configuration, FIG. 16 a block diagram of several cells of FIG. 10 placed in series according to a second configuration, FIG. 17 a block diagram of an optical disk reader comprising a device according to the invention.

FIG. 3 is a block diagram of the device according to the present embodiment example.

For the purpose of error correction proper, a circuit 1 comprises in series a syndrome generator 2, an equation solver 3, and a corrector 4.

A RAM memory 5 external to the circuit 1, for example of type SRAM, serves for storing certain raw data packets to be corrected and the corrected data. An internal RAM 6 used solely in CD mode is intended for storing the intermediate decoding results. This advantageously avoids too frequent access to the external memory 5.

The circuit 1 comprises moreover four multiplexers which, according to their state, define the CD mode of operation or the DVD mode of operation, as well as the various stages within the framework of each mode. A first multiplexer 7 selects at the input of the syndrome generator 2, either the data coming from the SRAM 5, or the data coming from memory 6. A second multiplexer 8 selects at the input of memory 6 either the data coming from the SRAM 5, or the data coming from outside of the circuit (line 1 in FIG. 3). A third multiplexer 9 selects at the input of the corrector 4, either data coming from the SRAM 5, or data coming from the memory 6, or data coming from the equation solver 3. A fourth multiplexer 10 supplies the SRAM 5 either with corrected data coming from the corrector 4 or with incoming data (1).

The memory 5 is used for storing the blocks of the DVD type, the error or erasure flags associated with these blocks before or after a correction pass, the blocks C2 of CD type for the purpose of interleaving before correction, of the error flags which are associated with it, the corrected blocks C1 and various synchronization data.

Each Reed-Solomon error correction pass carried out by the circuit 1 whether in CD or DVD mode may be summarized as follows.

Stage 1. Calculation of the syndromes $S_j$, of the polynomial of erasure E(z) and of the modified syndrome T(z):

$$S(z) = \sum_{j=0}^{r-1} S_j z^j$$

where r is the number of parity symbols in a code word, and where $$S_j = \sum_{i=0}^{n-1} r_i \alpha^{ij} \quad (1)$$

where n is the number of symbols of a code word, where the coefficients $r_i$ are such that
where r(z) is a received code word, and where $\alpha^i$ is a root of g(z), generating polynomial, $$E(z) = \prod_{k=1}^{e} (1 - z\alpha^{J_k}) \quad (2)$$

where $\alpha^{J_k}$ is the position of an erasure k and where e is the number of erasures, $$T(z) = S(z)E(z) \bmod z^{2t} \quad (3)$$

where t is a parameter of the RS code.

Comment: Parameter t depends upon the correction in progress. It is the number of syndromes to be calculated for each code word. It is equal to the number of parity symbols in the code word to be corrected: 4 and 4 for the two codings C1 and C2 of the compact disk, 10 and 16 for the internal and external codings of the DVD.

Stage 2. Utilizing Euclid's extended algorithm for calculating the polynomial of error localization Λ(z) and the polynomial of error evaluation Ω(z), and calculating the new polynomial of error localization Ψ(z), where $$\Psi(z) = \Lambda(z)E(z) \bmod z^{2t} \quad (4)$$

Stage 3. Utilizing Chien's algorithm to determine the roots of the polynomial of error localization. The roots of this polynomial indicate the positions of the errors and of the erasures in the bits received. Utilizing Forney's algorithm to determine the values of the errors and of the erasures from the roots of the polynomial of error localization, of the derivative of the polynomial of error localization and of the polynomial of error evaluation.

Stage 4. Verifying the decoding process and correcting the symbols received.

Moreover, the algorithms mentioned are known per se. Reference is made especially to the work "Reed-Solomon Codes and Their Applications" published by S. B. Wicker and V. K. Bhagarva, IEEE Press, 1994, regarding implementations of Euclid's algorithm and the algorithms of Chien and of Forney, and in general, the mathematical theory of the Reed-Solomon codes. There are, moreover, found in the literature other algorithms for implementing certain of the stages.

In the following will be described, firstly, the operation of the device in each mode, DVD or CD, then, secondly, the focus will be on describing in greater detail the hardware embodiment of certain aspects of the Reed-Solomon decoder, in particular the equation solver 3.

DVD Decoding

Figure 4:
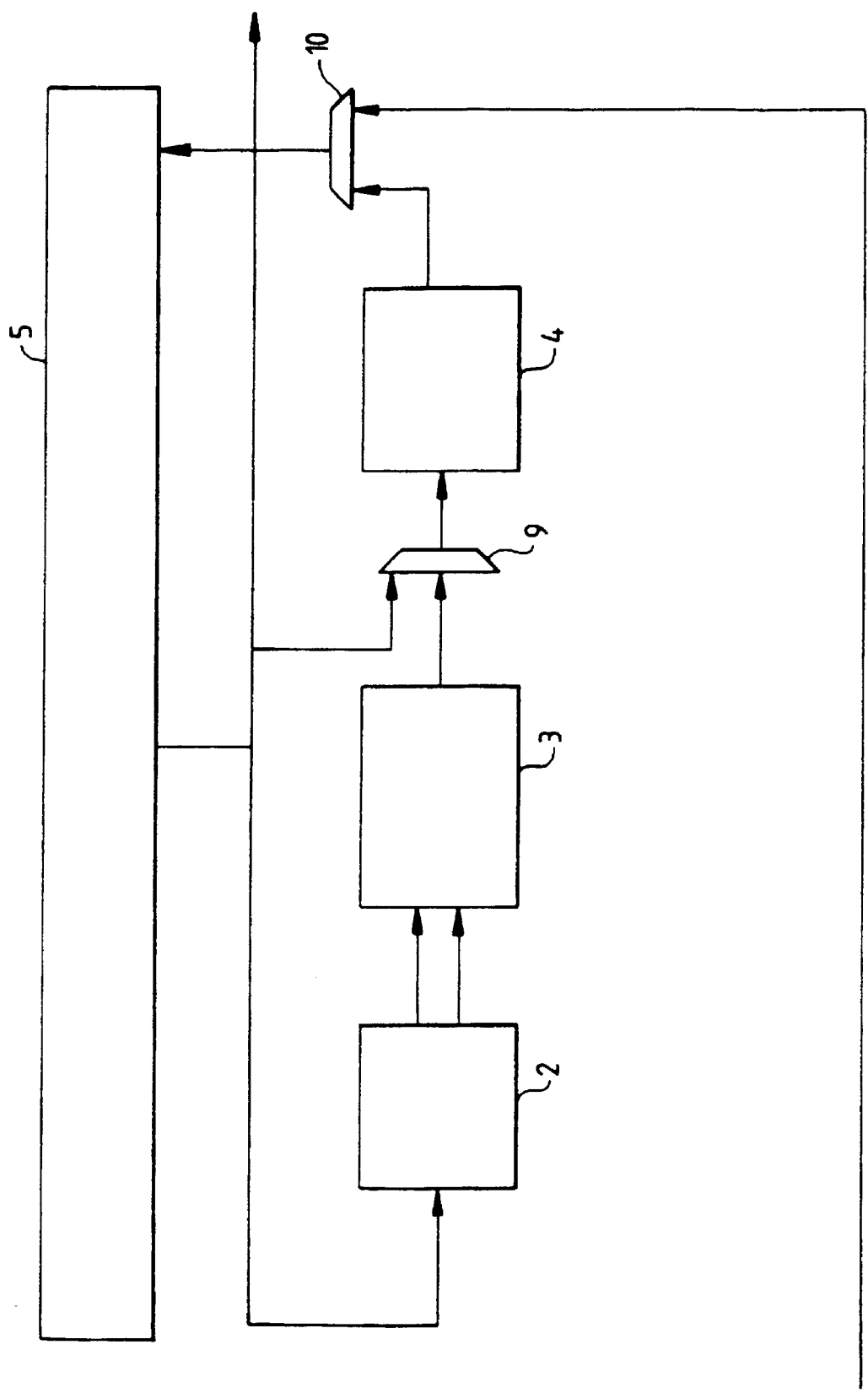

Operation in DVD mode is illustrated by FIG. 4. Relative to the general scheme of FIG. 3, the parts of the circuit 1 not concerned with the operation in DVD mode have been omitted.

(a) Internal Code (PI)-First Pass

Figure 6:
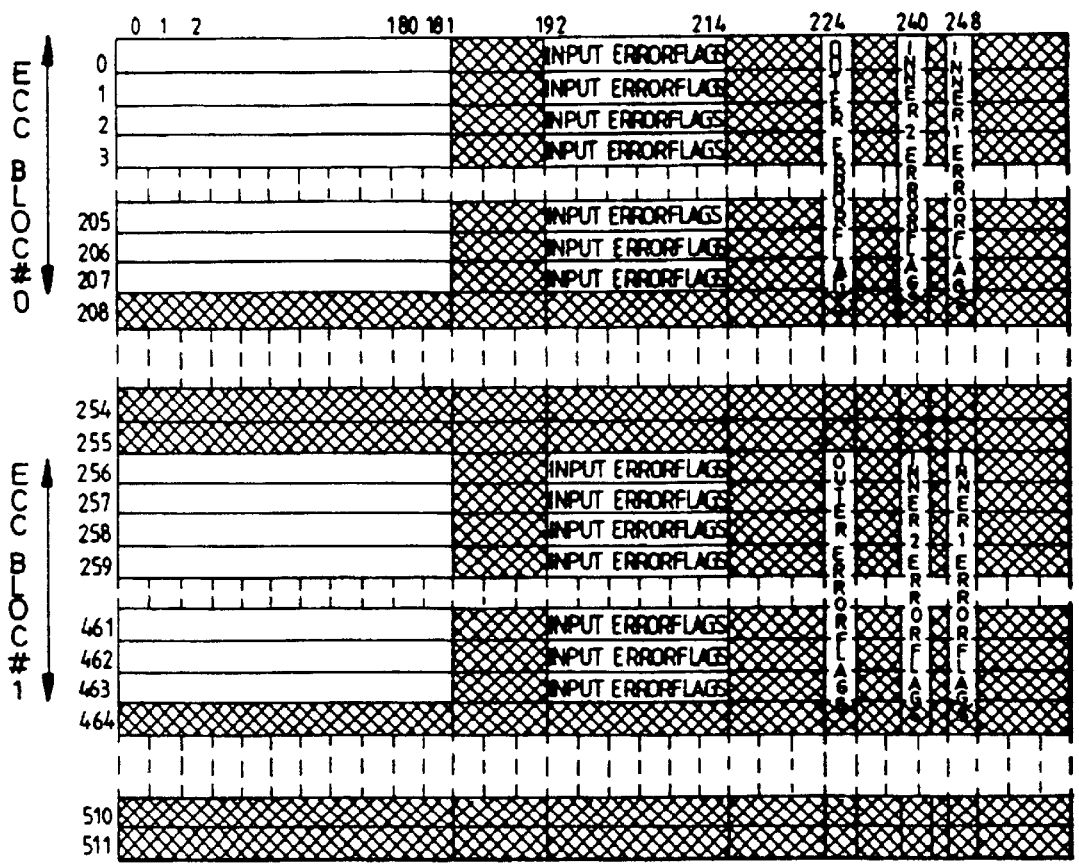

The incoming data are stored, at first, in the SRAM 5, transiting through the multiplexer 10. FIG. 6 shows the way in which the blocks are stored in the SRAM 5. These data are composed of two blocks of 208×182 bytes. Each block is accompanied by 208×23 erasure bytes. Each erasure bit indicates for a symbol of a block whether or not this symbol is to be considered as certain. This information is used subsequently during the Reed-Solomon error correction. These erasure bits are determined in a way known per se by a unit external to the circuit 1. According to the present embodiment example this external unit verifies for the presence of the data in a digital demodulation table.

The circuit initially proceeds to decoding the internal RS code PI. The block of data or symbols as well as the erasure bits are read line by line in the SRAM 5 and transferred to the syndrome generator 2. The latter determines for each line (each code word) the polynomial S(z) and the polynomial of erasure E(z) such as defined previously.

In practice, the syndromes $S_j$ are calculated in the following way:

$$Sj = \sum_{i=0}^{n-1} r_i T^{ij}$$

where T is the matrix associated with the generating polynomial G(z). According to the present example, $$G(z)=z^8+z^4+z^3+z^2+1.$$

In this case the matrix T is:

$$\begin{bmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 1 \\ 0 & 0 & 1 & 0 & 0 & 0 & 0 & 1 \\ 0 & 0 & 0 & 1 & 0 & 0 & 0 & 1 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{bmatrix}$$

The calculations of the $S_j$ syndromes are carried out by the generator 2 with the aid of j registers each looped on their respective input over a multiplier by $T^n$ and an adder. The syndromes $S_j$ constitute the coefficients of the polynomial S(z).

In the case of the DVD coding each line transferred comprises therefore 182 bytes of data, each byte representing a symbol, as well as 182 erasure bits, one for each symbol. Since the internal code PI is composed of 10 correction symbols, 10 syndromes are calculated. The generator 2 determines likewise from the erasure bits the coefficients Ej of the polynomial of erasure E(z) and stores them in an appropriate register.

If there are more than ten erasures in one line, the correction is not possible and the code word is marked as erroneous. The erroneous state of a code word is recorded in the SRAM memory (FIG. 6) in the form of a bit (inner 1 error flag).

The coefficients of S(z), and where applicable of E(z), are transmitted to the equation solver 3.

If a polynomial of erasure E(z) exists (at least one erasure), then circuit 3 calculates the polynomial T(z), the product of E(z) and d(z), subsequently executes the Euclid's extended algorithm to determine at the same time the polynomial of error localization Λ(z) and the polynomial of error evaluation Ω(z).

If no erasure exists, then the determination of Ω(z) and of Λ(z) is carried out directly from S(z) (regarding the calculations, in this case E(z)=1 is assumed).

The circuit 3 determines likewise where applicable Ψ(z).

The structure and the operation of circuit 3 will be apparent later in detail.

Corrector 4 executes in a manner known the algorithms of Chien and Forney.

Therefore, the corrector will lastly have available the following data:

The positions of the errors in the code word processed,

The values of these errors,

The number of erasures.

As a result, the errors in the code word are corrected as a result. To do this, the corrector circuit 4 (FIG. 4) reads the code word to be corrected in the SRAM memory 5 and the positions and values of the errors from the circuit 3. The corrector 4 writes the corrected code word into the SRAM 5 at the location of the initial code word. The multiplexers 9 and 10 are controlled as a result. If the capacity of the RS code is exceeded, the corrector enters an error indicator flag (referred to as 'Inner 1 Error Flag' in FIG. 6).

(b) External Code (PO)

The device subsequently carries out a second correction on the basis of the PO code. As a function of the result for each vertical code word, an error flag is at an appropriate value (referred to as 'Outer Error Flag' in FIG. 6).

(c) Internal Code (PI)-Second Pass

Once the PO correction is completed, a second horizontal correction is carried out on the basis of the internal code PI. Certain words which were not correctable during the first pass may become so after the correction of certain symbols of these words during the correction based on the PO code. Where applicable, error flags (referred to as 'Inner 2 Error Flag' in FIG. 6) are set at the appropriate value.

This latter pass may be optional.

CD Decoding

Figure 5:
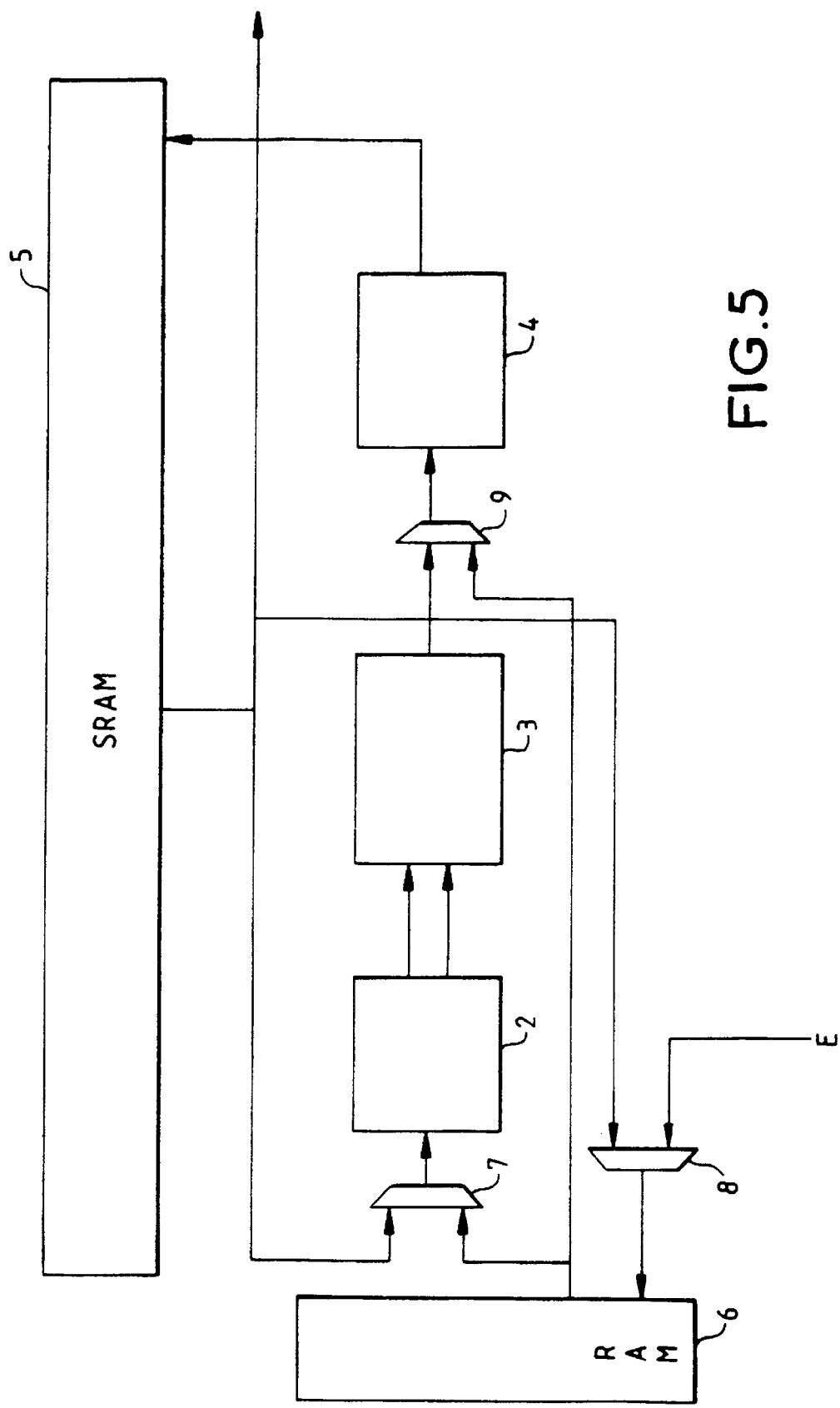

FIG. 5 illustrates the operation in CD mode. Relative to the general diagram of FIG. 3, the parts of the circuit 1 not involved with the operation in CD mode have been omitted.

Figure 7:
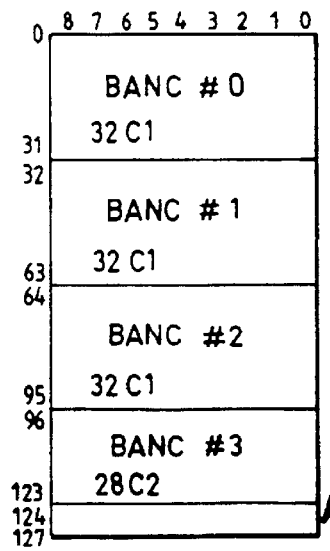

Initially, the data to be corrected (blocks C1 of 32 symbols) are entered into an internal RAM 6 through the input E. FIG. 7 illustrates the way in which the data are entered into this memory 6. Memory 6 comprises space for three blocks of 32 symbols each. The blocks C1 are interleaved when they are stored in memory 6. Given the nature of the interleaving, two blocks are necessary to obtain a code word C1. The location of the third block is used for writing the following C1 block, with this writing taking place during the correction of a previous block. 28 locations of the memory 6 are reserved for a code word of 28 symbols (code C2). Four locations are reserved for other information, which gives the memory a length of 128 words. The memory has a width of 9 bits, 8 bits being intended for storing symbols, the ninth indicating the erasures. Initially, the erasure bits indicate whether the stored symbols are valid or not valid. The syndrome generator 2 reads a first code word de-interleaved in the memory 6 as well as the corresponding erasure bits. The processing carried out by the circuit 2 as well as subsequently by the solver 3 are similar to that of the DVD mode, and it is understood that the parameters of the Reed-Solomon code are not the same. The principle of the correction, however, is identical.

The location of errors and their value are communicated by the solver 3 to the corrector 4. The latter receives from the RAM 6 all of the symbols of the code word besides the parity symbols C1. If a correction is necessary then the erroneous symbol is replaced by the corrected symbol. The symbols are subsequently stored in memory 5. It should be noted that in this "correction in swift flow" all of the symbols transit from the RAM memory 6 through the corrector 4 to the memory 5, while in DVD mode only the symbols to be corrected transit the memory 5 through the corrector and, again, toward the memory 5.

This architecture is based on the recognition of the fact that the code words in CD mode (28 or 32 symbols) are much shorter than in DVD mode (182 or 208 symbols). A correction in swift flow is carried out only on the 'short' code words and this from the rapid memory 6, for all the symbols of a code word must then transit through the corrector. Such a correction in swift flow on long code words would require more cycles on the part of the corrector 4 as well as the utilization of a memory 5 which is much faster and consequently more costly if the code words to be corrected in this manner are stored there.

This architecture consequently permits using a memory 5 available on the market, with the latter being disposed outside of the component comprising the device described here, and providing on the component itself an internal memory of small size, and therefore cost-effective. This applies in the case in which the memory 5 is implemented on a component other than the memory 6.

It is evident that naming the memories "external" or "internal" does not exclude the application of a so-called integrated circuit comprising simultaneously the memory 5 and the memory 6. Memory 5 must be viewed as a mass memory, whereas memory 6 [should be viewed] as a cache memory.

The interleaving of the symbols of the code words C2 is such that the 28 symbols of a given code word are distributed among 112 blocks of 32 symbols. To each code correction C1 corresponds a code correction C2. Thus, the system will only be correctly initialized after 112 frames. Moreover, to be able to carry out the interleaving of code C2 after the code correction C1, the symbols are stored in memory 5. which has a greater capacity than memory 6, and are re-read to be, on the one hand, entered into the memory 6 and, on the other hand, provided directly to the syndrome generator 2.

The entry into memory 6 is necessary for the correction of the code word by the corrector 4 "in swift flow," since, as mentioned in connection with the correction C1 in CD mode, the corrector reads the code words to be corrected not in the SRAM memory 5 but in the RAM 6.

The correction process C2 is similar to the one already explained for the correction C1. After the correction in swift flow, the corrected symbols are stored in memory 6, however, without the parity symbols of code C2.

Equation Solver-Determination of $\Omega(z)$ and of $\Lambda(z)$

The following part of the description relates to the implementation of the equation solver.

The main task of the equation solver (also referred to as 'Key Equation Solver' in English) is to determine the polynomials of localization and of evaluation of error, or $\Lambda(z)$ and $\Omega(z)$, respectively.

Figure 8:
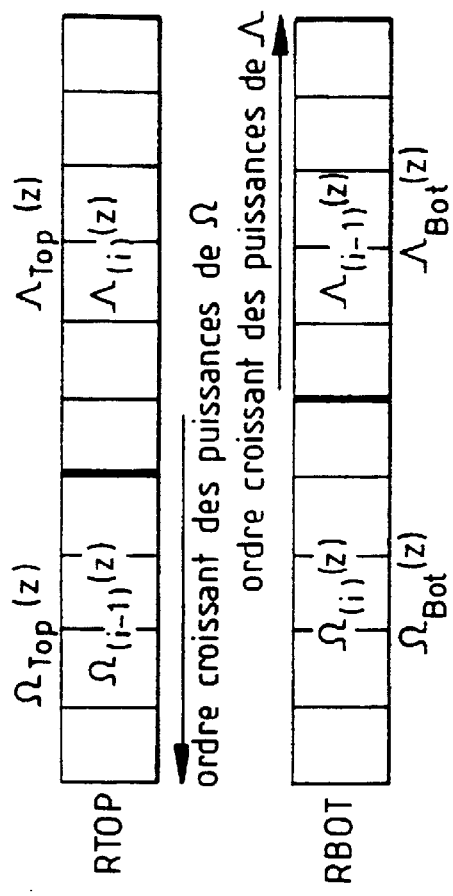

The determination of $\Omega(z)$ and of $\Lambda(z)$ is carried out by executing the Euclid's extended algorithm. In order to do so, two registers of polynomials, RTOP and RBOT, respectively, are used, which are illustrated in FIG. 8.

Euclid's extended algorithm is the following:

The polynomials $\Omega(z)$ and $\Lambda(z)$ satisfy the equation:

$$\Lambda(z) \cdot S(z) = \Omega(z) \bmod z^r \, \mathrm{degree} \, \Omega(z) < \mathrm{degree} \, \Lambda(z)$$

(The variable "r" is equal to the number of parity symbols of a code word (code correction capacity), i.e. to 21).

As initial values are taken:

$$\Lambda_{-1}(z) = 0$$

$$\Lambda_0(z) = 1$$

$$\Omega_{-1}(z) = Z^r$$

$$\Omega_0(z) = T(z)$$

(In the case where no erasure is known, $\Omega_0(z) = S(z)$ is also used)

The following iterations are carried out until:

$$\mathrm{degree} \, \Omega_n(z) < \mathrm{degree} \, \Lambda_n(z)$$

$$\Omega_n(z) = \Omega_{n-2}(z) \bmod_{n-1}(z) \, (A)$$

$$\Lambda_n(z) = \Lambda_{n-1}(z) * Q_n(z) + \Lambda_{n-2}(z) \, (B)$$

$$Q_n(z) = \Omega_{n-2}(z) \, div \, \Omega_{n-1}(z) \, (C)$$

The polynomial registers RTOP and RBOT each comprise r+1 registers (RTOP(k) and RBOT(k)) of 8 bits referred to as symbol registers. Each of these symbol registers stores a coefficient of one of the polynomials $\Lambda(z)$ or $\Omega(z)$. Each register RTOP and RBOT is separated into a part referred to as Lambda part and a part referred to as Omega, from right to left.

Initially the degree of $\Omega(z)$ is maximal and the degree of $\Lambda(z)$ is minimal. In the registers RTOP and RBOT the degrees of $\Omega(z)$ increase toward the left, while the degrees of $\Lambda(z)$ increase toward the right from the point of separation between parts Lambda and Omega.

Table 1 illustrates the content of the registers in the initial phase of the iteration.

TABLE 1

| Rank of register/cell | r + 1 | r | ... | 2 | 1 | 0 |
|---|---|---|---|---|---|---|
| RBOT | 1 | 0 | 0 | 0 | 0 | 1 |
| Pbot | 0 | 0 | 0 | 0 | 0 | 1 |
| RTOP | $T_{r-1}$ | $T_{r-2}$ | ... | $T_0$ | 0 | 0 |
| Ptop | 0 | 0 | ... | 0 | 1 | 1 |

The flags Ptop and Pbot indicate for each symbol register whether this register comprises a coefficient of $\Omega(z)$ (Ptop/Pbot=0) or of $\Lambda(z)$ (Ptop/Pbot=1).

Moreover, DegTop and DegBot are defined as degrees of the Omega parts of RTOP and RBOT respectively, as well as the variable "ratio" which designates the ratio RTOP(r+1)/RBOT(r+1).

The extended algorithm of Euclid is translated in this context by:

```
DegBot = r, DegTop = r − 1
WHILE (DegTop ≧ t) DO
IF ratio <> 0 AND (DegTop <DegBot)
SWITCH RTOP, RBOT
SWITCH DegTop, DegBot
SWITCH Ptop, Pbot
END IF
FOR k = r TO 0
IF (Pbot(k) = Ptop(k) = 1 THEN
RBOT(k) = RBOT(k) + ratio * RTOP(k)
RTOP(k + 1) = RTOP(k)
ELSE IF (Pbot(k) = Ptop(k) = 0) THEN
RTOP(k + 1) = RTOP(k) + ratio * RBOT(k)
ELSE
RTOP(k + 1) = RTOP(k)
END IF
Ptop(k + 1) = Ptop(k)
END FOR
DegTop = DegTop − 1
END WHILE
```

When it is necessary to take into account erasures, the condition of the WHILE becomes DegTop≧m, where m=t+ (degree E(z)/2).

Index k designates a cell of order k and the registers which are comprised in it.

r+1 cells, each cell comprising two registers of symbols of RTOP and RBOT, are defined having the same rank. Each cell must likewise perform the operations defined above.

Figure 9:
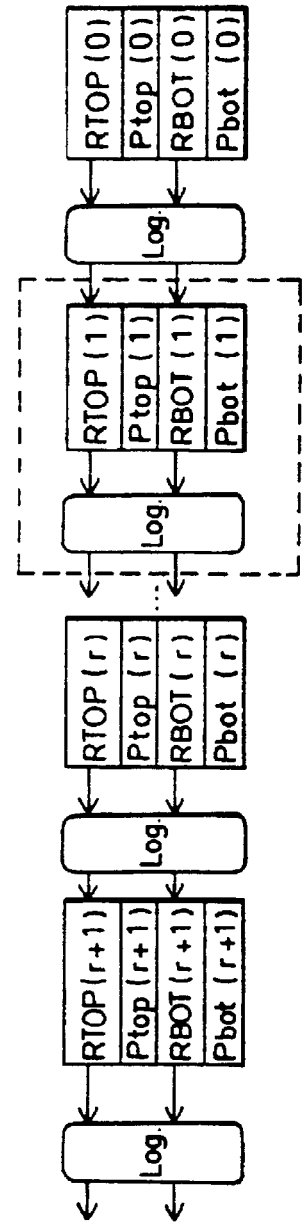

FIG. 9 is a diagram illustrating the connection of the r+1 cells to form the registers RTOP and RBOT. The rectangle in broken lines identifies a base cell which includes the various registers, multiplexers, adders, and the multiplier necessary for the implementation of the algorithm.

Figure 10:
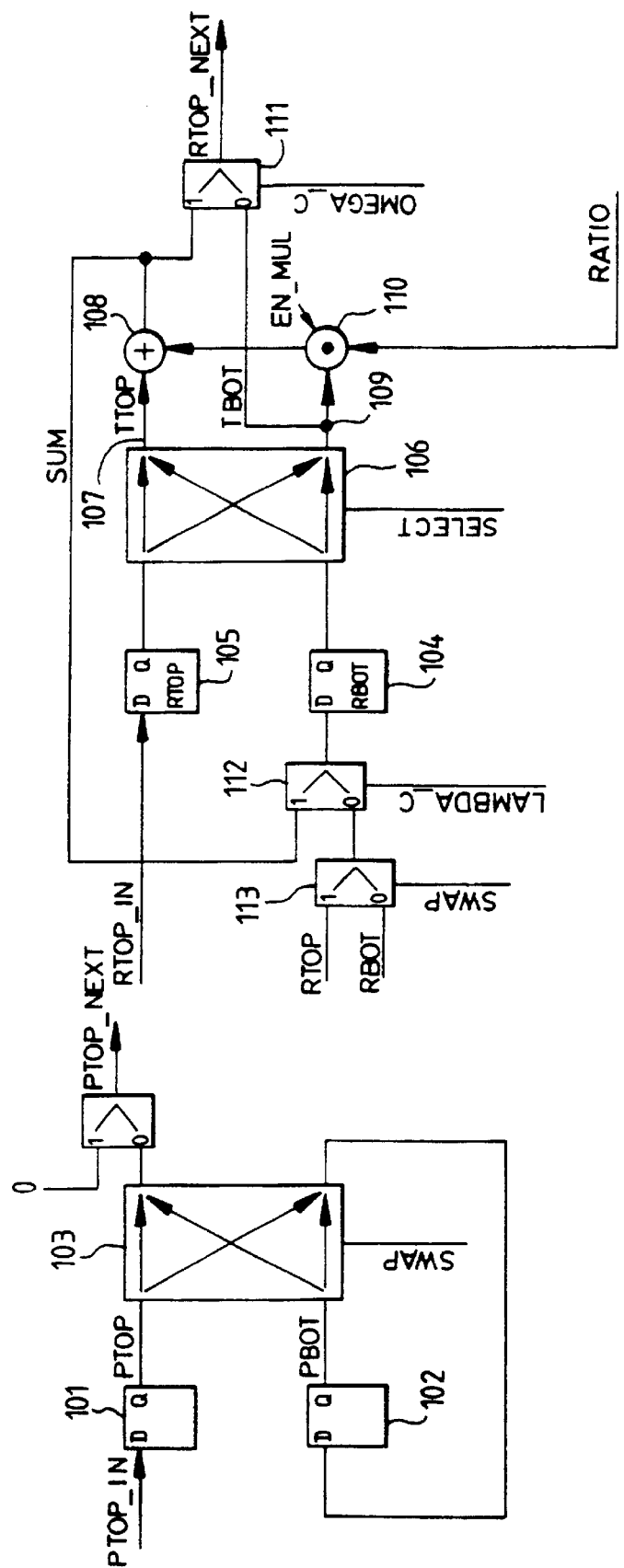

FIG. 10 is a functional diagram of a cell.

The cell comprises a register with one bit 101 intended to store the flag Ptop as well as a register with one bit 102 intended to store the flag Pbot. These registers are each composed of a half shift register D controlled appropriately. A reversing circuit 103 has two inputs connected respectively to the non-reversed outputs Q of registers 101 and 102 (signals Ptop and Pbot). This reversing circuit comprises two outputs, the first of which, referenced as Ptop NEXT, is connected to the input of the register equivalent to the register 101 of the next cell, and whose second output loops back on the input D of the register 102. According to the value of a SWAP control signal, Pbot is transmitted to the first output and Ptop to the second, or inversely.

The cell comprises likewise two 8 bit registers referenced as 104 and 105, which are part respectively of the register RBOT and RTOP. These 8 bit registers are formed for example of 8 1-bit registers connected in parallel. The respective outputs of registers 104 and 105 are each connected to an input of a reversing circuit 106 controlled by a SELECT signal.

The reversing circuit 106 in the image of the reversing circuit 103 connects each input either to one or the other of its outputs according to the state of the SELECT signal. The first output 107 of the reversing circuit 106 is connected to one input of an adder 108. The second output 109 of the reversing circuit 106 is connected to a multiplier 110 which multiplies the value present at the output 109 by the "ratio" variable. The output of the multiplier 110 is connected to an input of the adder 108.

The register 105 receives at its input D a signal RTOP_IN which corresponds to the output of the 8-bit register of RTOP of the preceding cell.

The output signal from the cell toward the next cell is referenced RTOP_NEXT. This output is composed of the output of a multiplexer 111 which selects according to the value of a control signal referenced OMEGAC, either the output from adder 108 or the second output 109 of the reversing circuit 106.

Finally, the input of register RBOT 104 is connected via a second multiplexer 112 according to the value of a command signal referenced LAMBDA_C either to the output of the adder 108 or to the output of a third multiplexer 113. This third multiplexer selects, according to the value of the SWAP command signal, either the contents of register 104 (RBOT) or that of register 105 (RTOP).

The command signals are worked out in the following way:

LAMBDA_C=Pbot AND Ptop

OMEGA_C=NOT (Pbot OR Ptop)

SELECT=NOT (SWAP XOR OMEGA_C)

EN_MUL=(LAMBDA_C OR OMEGA_C)

Figure 11:
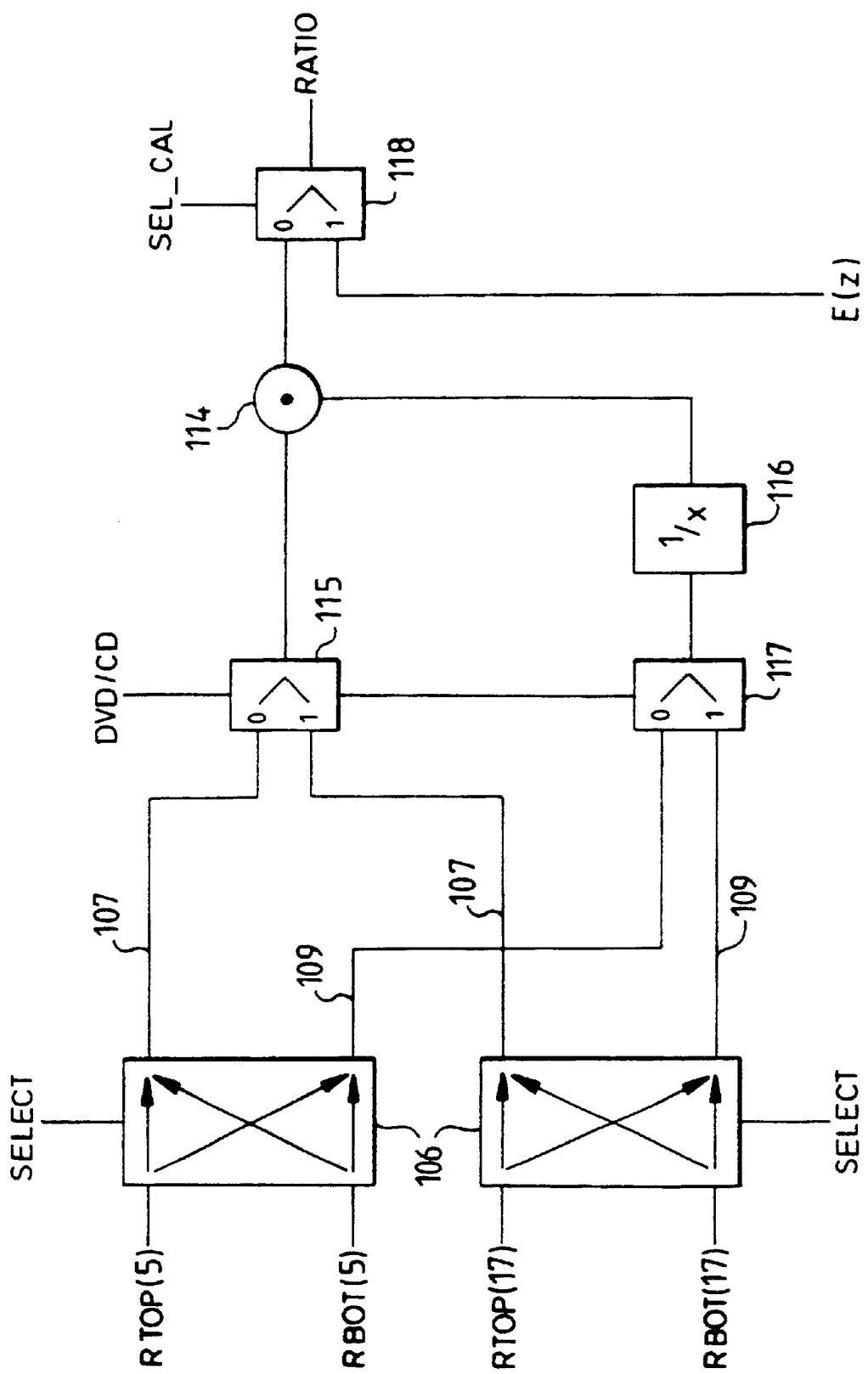

FIG. 11 represents the end of the cells forming the registers RTOP and RBOT. This end serves for calculating the ratio variable. In this FIG. 11 are represented the reversing circuits 106 of the weight of weight 5 and 17 on which are recovered either RTOP(5) and RBOT(5), or RTOP(17) and RBOT(17). As is clearly evident, the SELECT signal reverses the RTOP and RBOT data if applicable.

A multiplication circuit 114 having two inputs and one output permits calculating the product of two elements of the Galois field. The multiplication circuit 114 has one of its inputs connected to one of the outputs 107 from either the cell of weight 5 or from the cell of weight 17 via a fourth multiplexer 15 as a function of a DVD/CD signal which indicates the mode of operation.

An inversion circuit 116 having one input and one output brings about an inversion of the Galois field element. This inversion circuit 116 is composed of logic gates performing the equation[s] such that with an element $\alpha_i$ is associated an element $\alpha_p$ such that $\alpha_i * \alpha_p = 1$. The input of the inversion circuit 116 is connected to one of the outputs 109 from either the cell of weight 5 or the cell of 17 via a fifth multiplexer 117 as a function of the DVD/CD signal. The output of the inversion circuit 116 is connected to the other input of the multiplication circuit 114 such that the output of the multiplication circuit 114 provides either RTOP/RBOT or RBOT/RTOP as a function of the SELECT signal. The DVD/CD signal permits selecting the cells depending on whether the operation is taking place in CD mode or in DVD mode.

The ratio signal is provided via a sixth multiplexer 118 which chooses between the output of the multiplication circuit 114 and the elements forming the polynomial of erasure E(z) as a function of a signal SEL_CAL. The SEL_CAL signal is in a first state (for example 0) when the extended algorithm of Euclid, described in detail previously, is used so that the ratio variable will be equal to RTOP/RBOT or RBOTIRTOP. The signal SEL_CAL is in a second state (for example 1) when the calculation of the polynomial T(z) or the calculation of the polynomial of error correction Ψ(z) is carried out.

Figure 12:
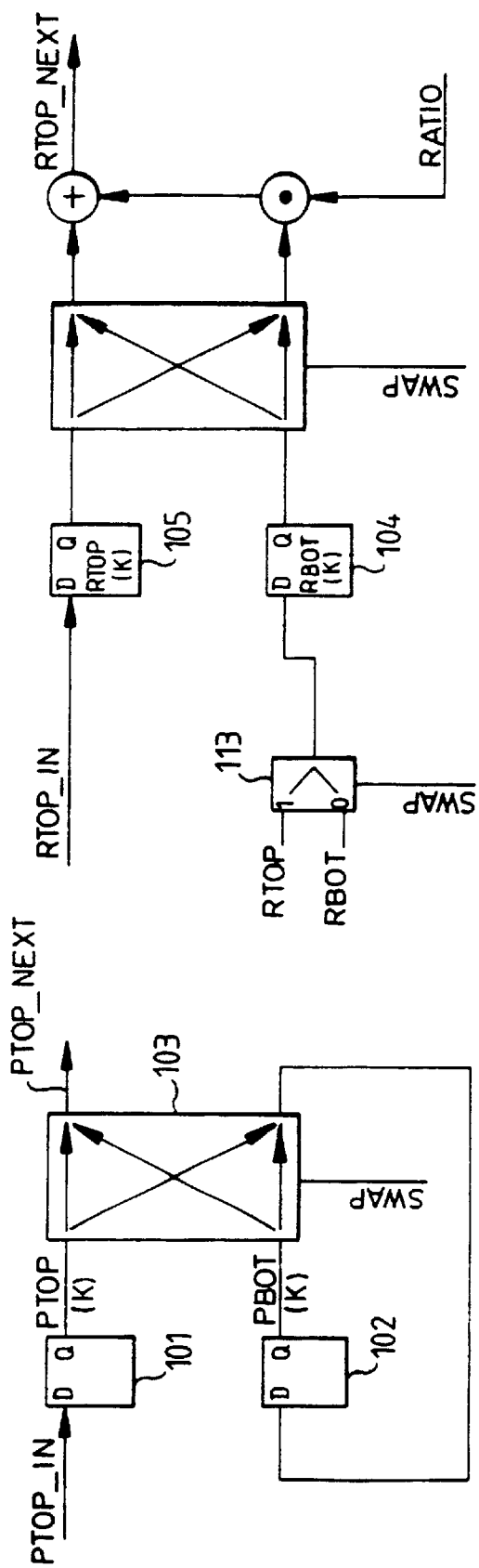

FIG. 12 represents a cell in the case where Ptop and Pbot are equal to 0. The two registers 104 and 105 of the cell in this case comprise the coefficients of Ω(z). This configuration of the cell is consequently referred to as the Omega configuration.

Similarly, FIGS. 13 and 14 represent a cell in the cases where Ptop=Pbot=1 and Ptop is different from Pbot, and are referred to as the Lambda and Mixed configurations.

TABLE 2

| Cell type | SWAP = 0 | SWAP = 1 |
|---|---|---|
| Lambda cell | $Pbot_{t+1}(k)=P_tbot(k)$<br>$Ptop\_NEXT_{t+1}(k)=Ptop_{t(k)}$<br>$RBOT_{t+1}(k)=RBOT_t(k)+$<br>$RTOP_t(k)*ratio$<br>$RTOP\_NEXT_{t+1}(k)=RTOP_t(k)$ | $Pbot_{t+1}(k)=P_ttop(k)$<br>$Ptop\_NEXT_{t+1}(k)=Pbot_t(k)$<br>$RBOT_{t+1}(k)=RTOP_t(k)+RBOT_t(k)*ratio$<br>$RTOP\_NEXT_{t+1}(k)=RBOT_t(k)$ |
| Omega cell | $Pbot_{t+1}(k)=P_tbot(k)$<br>$Ptop\_NEXT_{t+1}(k)=Ptop_{t(k)}$<br>$RBOT_{t+1}(k)=RBOT_t(k)$<br>$RBOT_{t+1}(k)=RBOT_t(k)+$<br>$RTOP_t(k)+RBOT_t(k)*ratio$ | $Pbot_{t+1}(k)=P_tbot(k)$<br>$Ptop\_NEXT_{t+1}(k)=Ptop_{t(k)}$<br>$RBOT_{t+1}(k)=RBOT_t(k)$<br>$RBOT_t+1(k)=RBOT_t(k)+RTOP_t(k)+RBOT_t(k)*ratio$ |
| Mixed cell | $Pbot_{t+1}(k)=P_tbot(k)$<br>$Ptop\_NEXT_{t+1}(k)=Ptop_{t(k)}$<br>$RBOT_{t+1}(k)=RBOT_t(k)$<br>$RTOP\_NEXT_{t+1}(k)=RTOP_t(k)$ | $Pbot_{t+1}(k)=P_tbot(k)$<br>$Ptop\_NEXT_{t+1}(k)=Ptop_{t(k)}$<br>$RBOT_{t+1}(k)=RBOT_t(k)$<br>$RTOP\_NEXT_{t+1}(k)=RTOP_t(k)$ |

The Lambda parts perform the multiplication of equation (B), while the Omega parts perform the division of the equation (C).

If, as an example, the polynomial S(z) is taken such that:

$$S(z)=\alpha^{14}z^5+\alpha^{10}z^4+\alpha^3z^3+\alpha^7z^2+\alpha^9z+\alpha^{12},$$

then the initial conditions are:

$$\Lambda_{-1}(z)=0$$

$$\Lambda_0(z)=1$$

$$\Omega_{-1}(z)=Z^6$$

$$\Omega_0(z)=S(z)$$

Tables 3 through 10 depict the contents of the cells at the end of each iteration of the algorithm.

TABLE 3

Initial conditions

| Rank | 7 | 6 | 5 | 4 | 3 | 2 | 1 | 0 |
|---|---|---|---|---|---|---|---|---|
| RBOT | 1 | 0 | 0 | 0 | 0 | 0 | 0 | 1 |
| Pbot | 0 | 0 | 0 | 0 | 0 | 0 | 0 | 1 |
| RTOP | $\alpha^{14}$ | $\alpha^{10}$ | $\alpha^3$ | $\alpha^7$ | $\alpha^9$ | $\alpha^{12}$ | 0 | 0 |
| Ptop | 0 | 0 | 0 | 0 | 0 | 0 | 1 | 1 |

(DegBot = 6 — DegTop = 5 — ratio = $\alpha^{14}$ — SWAP = 1)

TABLE 4

After SWAP

| Rank | 7 | 6 | 5 | 4 | 3 | 2 | 1 | 0 |
|---|---|---|---|---|---|---|---|---|
| RBOT | $\alpha^{14}$ | $\alpha^{10}$ | $\alpha^3$ | $\alpha^7$ | $\alpha^9$ | $\alpha^{12}$ | 0 | 1 |
| Pbot | 0 | 0 | 0 | 0 | 0 | 0 | 1 | 1 |
| RTOP | 1 | 0 | 0 | 0 | 0 | 0 | 0 | 1 |
| Ptop | 0 | 0 | 0 | 0 | 0 | 0 | 0 | 1 |

(DegBot = 5 — DegTop = 6 — ratio = $\alpha$ — SWAP = 0)

TABLE 5

Iteration 1

| Rank | 7 | 6 | 5 | 4 | 3 | 2 | 1 | 0 |
|---|---|---|---|---|---|---|---|---|
| RBOT | $\alpha^{14}$ | $\alpha^{10}$ | $\alpha^3$ | $\alpha^7$ | $\alpha^9$ | $\alpha^{12}$ | 0 | $\alpha$ |
| Pbot | 0 | 0 | 0 | 0 | 0 | 0 | 1 | 1 |
| RTOP | $\alpha^{11}$ | $\alpha^4$ | $\alpha^8$ | $\alpha^{10}$ | $\alpha^{13}$ | 0 | 1 | 0 |
| Ptop | 0 | 0 | 0 | 0 | 0 | 0 | 1 | 1 |

(DegBot = 5 — DegTop = 5 — ratio = $\alpha^{12}$ — SWAP = 0)

TABLE 6

Iteration 2

| Rank | 7 | 6 | 5 | 4 | 3 | 2 | 1 | 0 |
|---|---|---|---|---|---|---|---|---|
| RBOT | $\alpha^{14}$ | $\alpha^{10}$ | $\alpha^3$ | $\alpha^7$ | $\alpha^9$ | $\alpha^{12}$ | $\alpha^{12}$ | $\alpha$ |
| Pbot | 0 | 0 | 0 | 0 | 0 | 0 | 1 | 1 |
| RTOP | $\alpha^3$ | $\alpha^2$ | $\alpha^2$ | 1 | $\alpha^9$ | 1 | 0 | 0 |
| Ptop | 0 | 0 | 0 | 0 | 0 | 1 | 1 | 1 |

(DegBot = 5 — DegTop = 4 — ratio = $\alpha^3$ — SWAP = 1)

TABLE 7

After SWAP

| Rank | 7 | 6 | 5 | 4 | 3 | 2 | 1 | 0 |
|---|---|---|---|---|---|---|---|---|
| RBOT | $\alpha^3$ | $\alpha^2$ | $\alpha^2$ | 1 | $\alpha^9$ | 1 | 0 | 0 |
| Pbot | 0 | 0 | 0 | 0 | 0 | 1 | 1 | 1 |
| RTOP | $\alpha^{14}$ | $\alpha^{10}$ | $\alpha^3$ | $\alpha^7$ | $\alpha^9$ | $\alpha^{12}$ | $\alpha^{12}$ | $\alpha$ |
| Ptop | 0 | 0 | 0 | 0 | 0 | 0 | 1 | 1 |

(DegBot = 4 — DegTop = 5 — ratio = $\alpha^{11}$ — SWAP = 0)

TABLE 8

Iteration 3

| Rank | 7 | 6 | 5 | 4 | 3 | 2 | 1 | 0 |
|---|---|---|---|---|---|---|---|---|
| RBOT | $\alpha^3$ | $\alpha^2$ | $\alpha^2$ | 1 | $\alpha^9$ | 1 | $\alpha^3$ | $\alpha^{12}$ |
| Pbot | 0 | 0 | 0 | 0 | 0 | 1 | 1 | 1 |
| RTOP | $\alpha^9$ | $\alpha^8$ | $\alpha^8$ | $\alpha^6$ | $\alpha^{12}$ | $\alpha^{12}$ | $\alpha$ | 0 |
| Ptop | 0 | 0 | 0 | 0 | 0 | 1 | 1 | 1 |

(DegBot = 4 — DegTop = 4 — ratio = $\alpha^8$ — SWAP = 0)

TABLE 9

Iteration 4

| Rank | 7 | 6 | 5 | 4 | 3 | 2 | 1 | 0 |
|---|---|---|---|---|---|---|---|---|
| RBOT | $\alpha^3$ | $\alpha^2$ | $\alpha^2$ | 1 | $\alpha^9$ | $\alpha^{14}$ | $\alpha^{11}$ | $\alpha^{12}$ |
| Pbot | 0 | 0 | 0 | 0 | 0 | 1 | 1 | 1 |
| RTOP | 0 | 0 | 0 | $\alpha^{11}$ | $\alpha^{12}$ | $\alpha$ | 0 | 0 |
| Ptop | 0 | 0 | 0 | 0 | 1 | 1 | 1 | 1 |

(DegBot = 4 — DegTop = 3 — ratio = 0 — SWAP = 0)

TABLE 10

Iteration 5

| Rank | 7 | 6 | 5 | 4 | 3 | 2 | 1 | 0 |
|---|---|---|---|---|---|---|---|---|
| RBOT | $\alpha^3$ | $\alpha^2$ | $\alpha^2$ | 1 | $\alpha^9$ | $\alpha^{14}$ | $\alpha^{11}$ | $\alpha^{12}$ |
| Pbot | 0 | 0 | 0 | 0 | 0 | 1 | 1 | 1 |

TABLE 10-continued

Iteration 5

| Rank | 7 | 6 | 5 | 4 | 3 | 2 | 1 | 0 |
|------|---|---|---|---|---|---|---|---|
| RTOP | 0 | 0 | $\alpha^{11}$ | $\alpha^{12}$ | $\alpha$ | 0 | 0 | 0 |
| Ptop | 0 | 0 | 0 | 1 | 1 | 1 | 1 | 1 |

(DegBot = 4 — DegTop = 2 — ratio = 0 — SWAP = 0)

One lastly obtains:

$$\Lambda(z)=\alpha^{12}z^2+\alpha^{11}z+\alpha^{14}$$

The coefficients of $\Lambda(z)$ are stored in the Lambda part of RBOT, while the coefficients of $\Omega(z)$ are stored in the Omega part of RTOP.

After the calculation of $\Lambda(z)$ and of $\Omega(z)$ it is necessary to adjust the coefficients of $\Omega(z)$ by looping back RTOP(r+1) on RTOP(2) and by making m=t+(Degree E(z)/2) rotations.

Determination of T(z)-modified Syndrome

The operating principle is the following:

Firstly, the coefficients of S(z) are stored in the RTOP registers. A 0 is present at the input of the first register RTOP(0).

Secondly, the coefficients $E_j$ of E(z) are supplied in order of index crossing to the input E at the rate of one coefficient per clock cycle.

The number of clock cycles necessary to do the multiplication is equal to the degree of E(z).

By way of example, Table 11 gives the contents of each of the registers in the case of a multiplication of S(z) and of E(z) where S(z) is of degree 3 and E(z) is of degree 3.

TABLE 11

| Clock cycle | Cell Register | 4 | 3 | 2 | 1 |
|---|---|---|---|---|---|
|   | RBOT | 0 | 0 | 0 | 0 |
|   | RTOP | $S_3$ | $S_2$ | $S_1$ | $S_0$ |
| 1 | RBOT | $S_3E_0$ | $S_2E_0$ | $S_1E_0$ | $S_0E_0$ |
|   | RTOP | $S_2$ | $S_1$ | $S_0$ | 0 |
| 2 | RBOT | $S_3E_0 + S_2E_1$ | $S_2E_0 + S_1E_1$ | $S_1E_0 + S_0E_1$ | $S_0E_0$ |
|   | RTOP | $S_1$ | $S_0$ | 0 | 0 |
| 3 | RBOT | $S_3E_0 + S_2E_1 + S_1E_2$ | $S_2E_0 + S_1E_1 + S_0E_2$ | $S_1E_0 + S_0E_1$ | $S_0E_0$ |
|   | RTOP | $S_0$ | 0 | 0 | 0 |
| 4 | RBOT | $S_3E_0 + S_2E_1 + S_1E_2 + S_0E_3$ | $S_2E_0 + S_1E_1 + S_0E_2$ | $S_1E_0 + S_0E_1$ | $S_0E_0$ |
|   | RTOP | 0 | 0 | 0 | 0 |

The equation solver is advantageously also used to multiply the polynomials E(z) and S(z) for the calculation of the modified syndrome T(z). The equation solver already has available the necessary multipliers because the determination of the polynomial $\Lambda(z)$ requires a multiplication of polynomials. These means are advantageously utilized for the results from the multiplication of E(z)*S(z), which simplifies the composition of the generator 2.

The maximum degree of S(z) is 2t−1=r−1 while that of E(z) is 2t=r by construction (if the degree of E(z) is greater than 2t, the code word is marked as not correctable). The maximum degree of T(z) is therefore r+1 which corresponds exactly to the number of cells of the equation solver.

Figure 15:
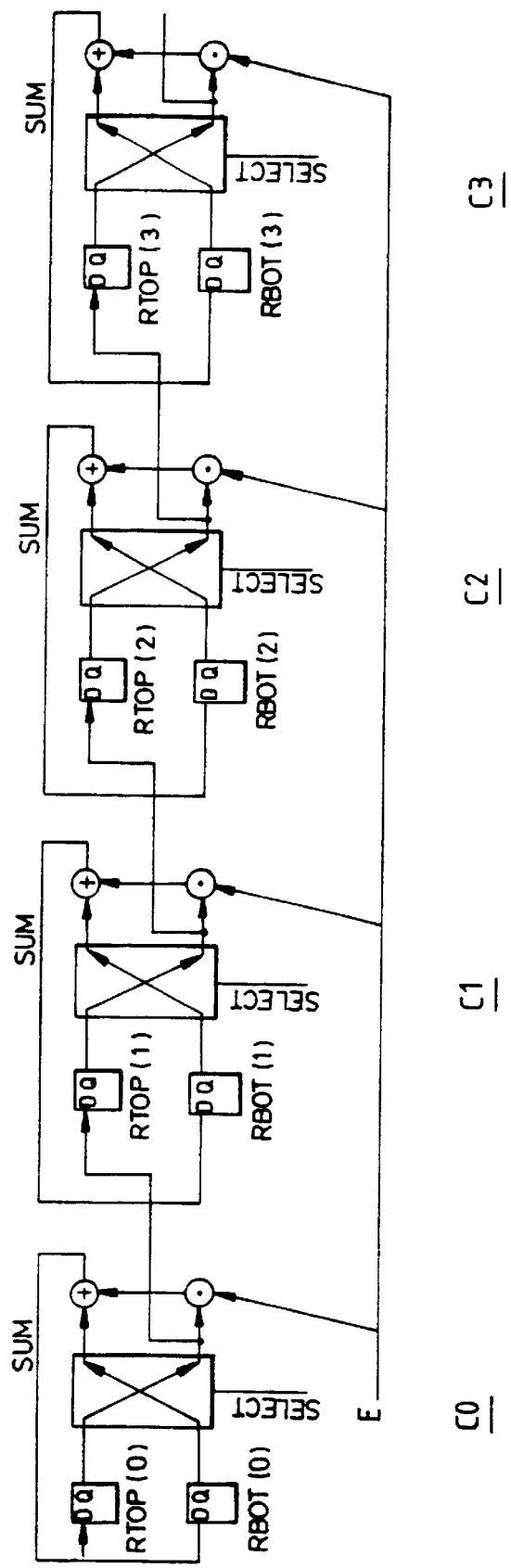

FIG. 15 illustrates the configuration of a cell for executing a multiplication. The registers Ptop and Pbot serve to determine the contents of registers RTOP(k) and RBOT(k). The configuration of the cells is rather close to that illustrated by the diagram of FIG. 13 (Ptop=Pbot=1), i.e. the Lambda configuration. Each RBOT register loops back on its input through the associated adder 108 while the input of each RTOP register is connected to the output of the RTOP register of the previous cell. Lastly, the set of the multipliers of the cells are connected to the same input E with a view toward the introduction of the coefficients in series of one of the two polynomials to be multiplied. Within the framework of the present example it is the coefficients of E(z) which are introduced by this expedient, but one may likewise introduce the coefficients of S(z). The input E served in the configuration used for the determination of $\Lambda(z)$ and of $\Omega(z)$ to provide the value of "ratio" to each cell.

Another difference from the Lambda configuration of FIG. 13 is that the state of the reversing circuit 106 remains identical throughout the multiplication.

It is evident that the registers RTOP(k) form a shift register serving solely to store the coefficients of S(z). The shift register is implemented by correctly choosing the state of the reversers 106. The registers RBOT(k)) serve as respective accumulators for each coefficient of the polynomial T(z).

Each register RBOT(k) therefore lastly comprises the coefficient $T_k$ where $$T(z) = \sum_{k=1}^{r} T_k z^k.$$

Determination of the New Error Localization Polynomial $\Psi(z)$

The equation solver is also advantageously used to multiply the polynomials E(z) and $\Lambda(z)$ for the calculation of $\Psi(z)$. This latter polynomial is calculated one time $\Lambda(z)$ as determined by the equation solver. Once Euclid's extended algorithm is utilized, the coefficients of $\Lambda(z)$ are stored in the Lambda part of RBOT. The other registers RTOP(k) and RBOT(k) are set to zero.

Figure 16:
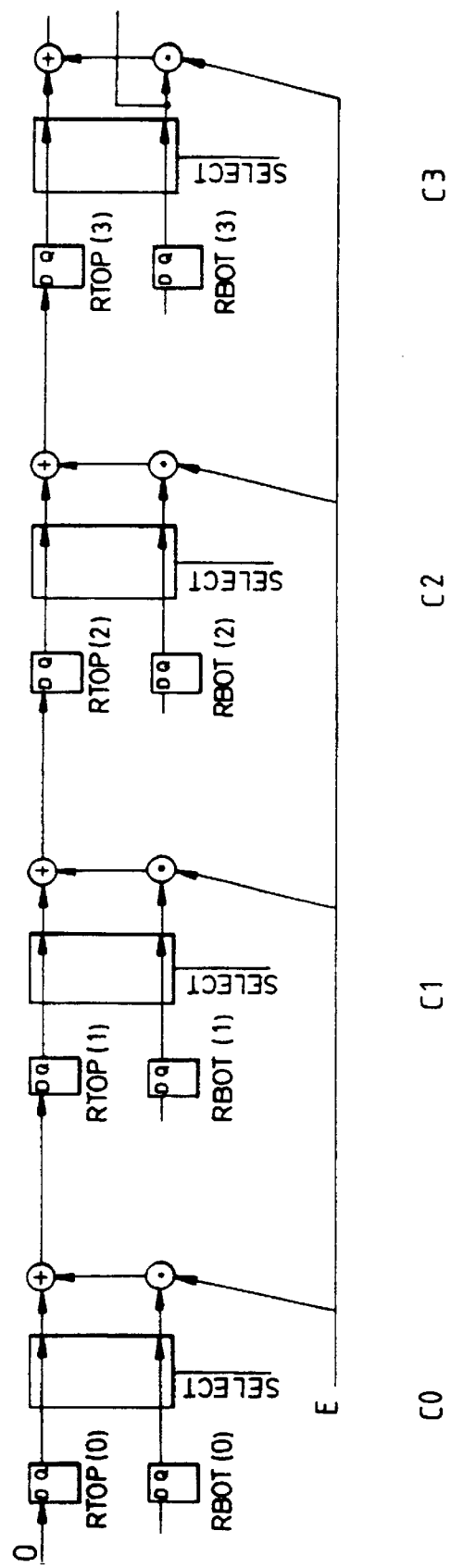

The configuration of the cells for doing the multiplication is illustrated by the diagram of FIG. 16.

The registers RTOP(k) are connected in series through the adders of the cells. The value 0 is presented at the input of the first register RTOP(0). The output of each register RBOT(k) is connected to the multiplier of its k cell. The values stored in the registers RBOT(k) do not change during the current multiplication. As in the configuration of FIG. 15, the inputs of the multipliers, other than those connected to the output of the registers RBOT(k), are interconnected (reference E).

The degree of Λ(z) is equal to the number of errors. The degree of E(z) is equal to the number of erasures.

Table 12 gives the contents of the cell after each clock cycle.

TABLE 12

| Cycle | Register | ... | 7 | 6 | 5 | 4 | 3 | 2 | 1 | 0 |
|---|---|---|---|---|---|---|---|---|---|---|
|   | RBOT | 0 | 0 | 0 | 0 | 0 | 0 | $\Lambda_0$ | $\Lambda_1$ | $\Lambda_2$ |
|   | RTOP | 0 | 0 | 0 | 0 | 0 | 0 | 0 | 0 | 0 |
| 1 | RBOT | 0 | 0 | 0 | 0 | 0 | 0 | $\Lambda_0$ | $\Lambda_1$ | $\Lambda_2$ |
|   | RTOP | 0 | 0 | 0 | 0 | 0 | $\Lambda_0 E_0$ | $\Lambda_1 E_0$ | $\Lambda_2 E_0$ | 0 |
| 2 | RBOT | 0 | 0 | 0 | 0 | 0 | 0 | $\Lambda_0$ | $\Lambda_1$ | $\Lambda_2$ |
|   | RTOP | 0 | 0 | 0 | 0 | $\Lambda_0 E_0$ | $\Lambda_1 E_0 + \Lambda_0 E_1$ | $\Lambda_2 E_0 + \Lambda_1 E_1$ | $\Lambda_2 E_1$ | 0 |
| 3 | RBOT | 0 | 0 | 0 | 0 | 0 | 0 | $\Lambda_0$ | $\Lambda_1$ | $\Lambda_2$ |
|   | RTOP | 0 | 0 | 0 | $\Lambda_0 E_0$ | $\Lambda_1 E_0 + \Lambda_0 E_1$ | $\Lambda_2 E_0 + \Lambda_1 E_1 + \Lambda_0 E_2$ | $\Lambda_2 E_1 + \Lambda_1 E_2$ | $\Lambda_2 E_2$ | 0 |
| 4 | RBOT | 0 | 0 | 0 | 0 | 0 | 0 | $\Lambda_0$ | $\Lambda_1$ | $\Lambda_2$ |
|   | RTOP | 0 | 0 | $\Lambda_0 E_0$ | $\Lambda_1 E_0 + \Lambda_0 E_1$ | $\Lambda_2 E_0 + \Lambda_1 E_1 + \Lambda_0 E_2$ | $\Lambda_2 E_1 + \Lambda_1 E_2 + \Lambda_0 E_3$ | $\Lambda_2 E_2 + \Lambda_1 E_3$ | $\Lambda_2 E_3$ | 0 |

During the calculation of Ψ(z) the multipliers remaining active are those of the cells for which ot(k)=1.

Although the present embodiment example relates to the Reed Solomon correction, the configuration of two memories described may be applied in all cases where data packets of perceptibly different length must be corrected.

Figure 17:
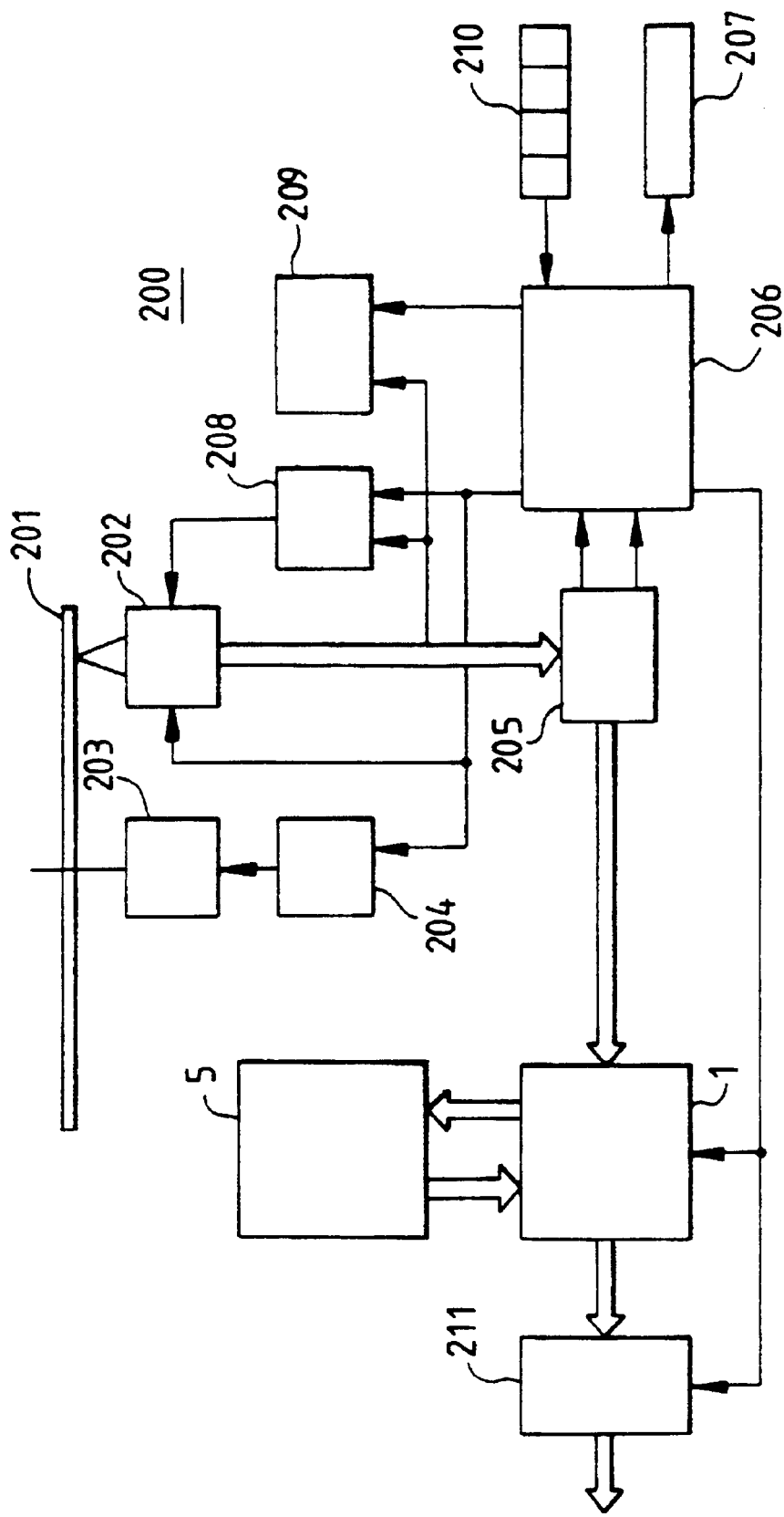

Lastly, FIG. 17 represents an optical disk reader 201 comprising the device according to the invention. This reader comprises an optical unit 202 comprising in a known manner a laser, means of focusing, [and] photoelectric detectors. The reader comprises likewise a motor 203 controlled by a servo unit 204. The data read by the optical unit are transmitted to a demultiplexer 205. The control data are transmitted to a microprocessor 206 controlling a display 207, the focusing servo 208 and the tracking 209. A keypad 210 permits the user to control the reader.

The CDIDVD data packets per se are transmitted by the demultiplexer 205 to the coding device 1 connected to memory 5 and to an interpolation unit 211 which serves as interface with the digital-analog converters not being illustrated.

It is understood that if an algorithm other than Euclid's extended algorithm is used and this algorithm also requires multipliers of polynomials, the invention may likewise be applied.

What is claimed is:

1. A coder-decoder of the Reed-Solomon type comprising:
    a syndrome generator for receiving a flow of data and for providing a polynomial of syndrome and a polynomial of erasure;
    means for implementing Euclid's algorithm for receiving said polynomial of syndrome and polynomial of erasure and for providing a polynomial of error localization; and
    means for correcting errors in the data flow with the aid of the polynomial of error localization, and in which the implementing means comprises first and second registers for storing two intermediate polynomials of localization and of evaluation of error wherein the registers are divided into elementary cells set in series and comprising multiplexing means and calculation means such that during a cycle of a clock signal the data stored in the two registers are shifted and a calculation operation is carried out for the data in one of the registers and it is subsequently possible to exchange simultaneously the data between the two registers.

2. The coder-decoder according to claim 1, wherein the implementing means is arranged to produce the product of the polynomial of error localization and of the polynomial of erasure for obtaining the polynomial of error localization.

3. The coder-decoder according to claim 1, wherein the implementing means is arranged to yield the product of the polynomial of syndromes by the polynomial of erasure.

4. The coder-decoder according to claim 1, wherein the implementing means comprises r+1 cells in series, r being the maximum number of redundant symbols, each cell comprising a first register for the storage of a polynomial coefficient, a second register for the storage of a polynomial coefficient, a circuit for connecting the first register to a first input of an adder and the second register to a first input of a multiplier or inversely, the input of the first register being connected to an output of the preceding cell, the input of the second register being connected to multiplexing means whose inputs are connected to the output of the first register and of the second register of the preceding cell and to the output of the adder, the output of the cell being composed of a multiplexer whose inputs are connected to the output of the adder and to the output of the circuit connected to the first input of the multiplier, a second input of the adder being connected to the output of the multiplier, with a second input of the multiplier being suitable for receiving a multiplication coefficient.

5. The coder-decoder according to claim 4, wherein the second inputs of the multipliers of the cell are connected.

6. The coder-decoder according to claim 4, wherein for the multiplication of the polynomials of erasure and of syndromes the output of the first register of one cell is connected to the multiplier, the output of the second register is connected to the adder, the output of the cell being composed of the first input of the multiplier, and the input of the second register being connected to the output of the adder.

7. The coder-decoder according to claim 6, wherein the coefficients of one of the two polynomials to be multiplied are stored in the first registers of the cells in the initialization phase, while the coefficients of the other polynomial are supplied one by one to the second input of the multiplier.

8. The coder-decoder according to claim 4, wherein for the multiplication of the polynomials of error localization and of erasure, the first register of a cell is connected to the output of the adder of the preceding cell, the output of the first register is connected to the first input of the adder, and the output of the second register is connected to the first input of the multiplier.

9. The coder-decoder according to claim 8, wherein the coefficients of the polynomial of localization are stored in the second registers of the cells in the initialization phase, with the contents of these second registers not evolving during the multiplication, the coefficients of the polynomial of erasure being supplied one by one to the second inputs of the multipliers of the cells.

10. A reader of optical disks which comprises a coder-decoder of the Reed-Solomon type, the reader comprising:
a syndrome generator for receiving a flow of data and for providing a polynomial of syndrome and a polynomial of erasure;
means for implementing Euclid's algorithm for receiving said polynomial of syndrome and polynomial of erasure and for providing a polynomial of error localization; and
means for correcting errors in the data flow with the aid of the polynomial of error localization, in which the implementing means comprises first and second registers for storing two intermediate polynomials of localization and of evaluation of error, wherein the registers are divided into elementary cells set in series and comprising multiplexing means and calculation means such that during a cycle of a clock signal the data of the two registers are shifted and a calculation operation is carried out for the data in one of the registers and it is subsequently possible to exchange simultaneously the data between the two registers.

11. The reader according to claim 10, wherein the implementing means is arranged to produce the product of the polynomial of error localization and of the polynomial of erasure for obtaining the polynomial of error localization.

12. The reader according to claim 10, wherein the implementing means is arranged to yield the product of the polynomial of syndromes by the polynomial of erasure.

13. The reader according to claim 10, wherein the implementing means comprises r+1 cells in series, r being the maximum number of redundant symbols, each cell comprising a first register for the storage of a polynomial coefficient, a second register for the storage of a polynomial coefficient, a circuit for connecting the first register to a first input of an adder and the second register to a first input of a multiplier or inversely, the input of the first register being connected to an output of the preceding cell, the input of the second register being connected to multiplexing means whose inputs are connected to the output of the first register and of the second register of the preceding cell and to the output of the adder, the output of the cell being composed of a multiplexer whose inputs are connected to the output of the adder and to the output of the circuit connected to the first input of the multiplier, a second input of the adder being connected to the output of the multiplier, with a second input of the multiplier being suitable for receiving a multiplication coefficient.

14. The reader according to claim 13, wherein the second inputs of the multipliers of the cell are connected.

15. The reader according to claim 13, wherein for the multiplication of the polynomials of erasure and of syndromes the output of the first register of one cell is connected to the multiplier, the output of the second register is connected to the adder, the output of the cell is composed of the first input of the multiplier, and the input of the second register is connected to the output of the adder.

16. The reader according to claim 15, wherein the coefficients of one of the two polynomials to be multiplied are stored in the first registers of the cells in the initialization phase, while the coefficients of the other polynomial are supplied one by one to the second input of the multiplier.

17. The reader according to claim 13, wherein for the multiplication of the polynomials of error localization and of erasure, the first register of a cell is connected to the output of the adder of the preceding cell, the output of the first register is connected to the first input of the adder, and the output of the second register is connected to the first input of the multiplier.

18. The reader according to claim 17, wherein the coefficients of the polynomial of localization are stored in the second registers of the cells in the initialization phase, with the contents of these second registers not evolving during the multiplication, the coefficients of the polynomial of erasure being supplied one by one to the second inputs of the multipliers of the cells.

* * * * *